United States Patent
Surthi et al.

(10) Patent No.: US 9,070,584 B2
(45) Date of Patent: Jun. 30, 2015

(54) BURIED DIGITLINE (BDL) ACCESS DEVICE AND MEMORY ARRAY

(71) Applicant: NANYA TECHNOLOGY CORP., Tao-Yuan Hsien (TW)

(72) Inventors: Shyam Surthi, Boise, ID (US); Lars Heineck, Garden City, ID (US)

(73) Assignee: NANYA TECHNOLOGY CORP., Gueishan Dist., Taoyuan (TW)

( * ) Notice: Subject to any disclaimer, the term of this patent is extended or adjusted under 35 U.S.C. 154(b) by 0 days.

(21) Appl. No.: 13/901,592

(22) Filed: May 24, 2013

(65) Prior Publication Data

US 2014/0346652 A1 Nov. 27, 2014

(51) Int. Cl.
*H01L 27/108* (2006.01)
*H01L 23/522* (2006.01)

(52) U.S. Cl.
CPC .... *H01L 27/10894* (2013.01); *H01L 27/10885* (2013.01); *H01L 27/10891* (2013.01); *H01L 23/5225* (2013.01)

(58) Field of Classification Search
CPC ............ H01L 21/76264; H01L 21/764; H01L 21/7682; H01L 27/10823; H01L 27/10876; H01L 27/10885; H01L 29/66666; H01L 29/7827; H01L 23/5225; H01L 2221/1042
USPC ........... 257/296, 302, 329; 438/242, 268, 270
See application file for complete search history.

(56) References Cited

U.S. PATENT DOCUMENTS

| | | | | |
|---|---|---|---|---|
| 6,060,388 | A | * | 5/2000 | Akatsu et al. ................. 438/637 |
| 6,504,201 | B1 | * | 1/2003 | Noble et al. ................... 257/302 |
| 8,319,278 | B1 | * | 11/2012 | Zeng et al. ..................... 257/330 |
| 2006/0189063 | A1 | * | 8/2006 | Hueting et al. ............... 438/209 |
| 2007/0246754 | A1 | * | 10/2007 | Sonsky et al. ................. 257/288 |
| 2011/0266620 | A1 | * | 11/2011 | Terrill ............................. 257/343 |
| 2013/0012017 | A1 | * | 1/2013 | Edelstein et al. ............. 438/619 |
| 2013/0146958 | A1 | * | 6/2013 | Kim et al. ...................... 257/302 |
| 2014/0061745 | A1 | * | 3/2014 | Myung et al. ................. 257/302 |

* cited by examiner

*Primary Examiner* — Tucker Wright
*Assistant Examiner* — Mark Hatzilambrou
(74) *Attorney, Agent, or Firm* — Winston Hsu; Scott Margo

(57) ABSTRACT

A memory array includes a plurality of digitline (DL) trenches extending along a first direction; a buried digitline between the DL trenches; a trench fill material layer sealing an air gap in each of the DL trenches; a plurality of wordline (WL) trenches extending along a second direction; an active chop (AC) trench disposed at one end of the buried digitline; a shield layer in the air gap; and a sidewall conductor around the sidewall of the AC trench.

11 Claims, 4 Drawing Sheets

BURIED DIGITLINE (BDL) ACCESS DEVICE AND MEMORY ARRAY

BACKGROUND OF THE INVENTION

1. Field of the Invention

The present invention relates generally to the field of integrated circuit fabrication and, more particularly, to a buried digitline (BDL) access device with a metal shield between digitlines, and a memory array using such BDL access device.

2. Description of the Prior Art

A continuous challenge in the semiconductor memory industry is to decrease the size of memory cell components in order to increase the packing density of the DRAM chip. Over the last few device generations, DRAM manufacturers have developed alternative cell layouts that reduce the area they occupy on the chip. The latest designs allow a significant increase in density by burying the address lines or digit lines in the silicon substrate, then fabricating the transistor and capacitor on top to form a vertical stack. Such devices are also known as buried digitline (BDL) access devices.

However, the current BDL technology still has several drawbacks. For example, the BDL access device has high digitline-to-digitline (DL-DL) coupling capacitance as a percentage of the total digitline capacitance. The higher percentage of DL-DL coupling causes significant sense margin loss even though the total digitline capacitance may be lower than other technologies. Hence, it is desired to provide an improved BDL device for DRAM applications, which are capable of reducing the percentage of DL-DL coupling compared with the total DL capacitance.

SUMMARY OF THE INVENTION

It is one objective to provide an improved BDL device in order to solve the above-mentioned prior art problems and shortcomings.

In one aspect of the invention, a memory array is provided. The memory array includes a plurality of digitline (DL) trenches extending along a first direction; a buried digitline between the DL trenches; a trench fill material layer sealing an air gap in each of the DL trenches; a plurality of wordline (WL) trenches extending along a second direction; an active chop (AC) trench disposed at one end of the buried digitline; a shield layer in the air gap; and a sidewall conductor around the sidewall of the AC trench.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

Figure 1:
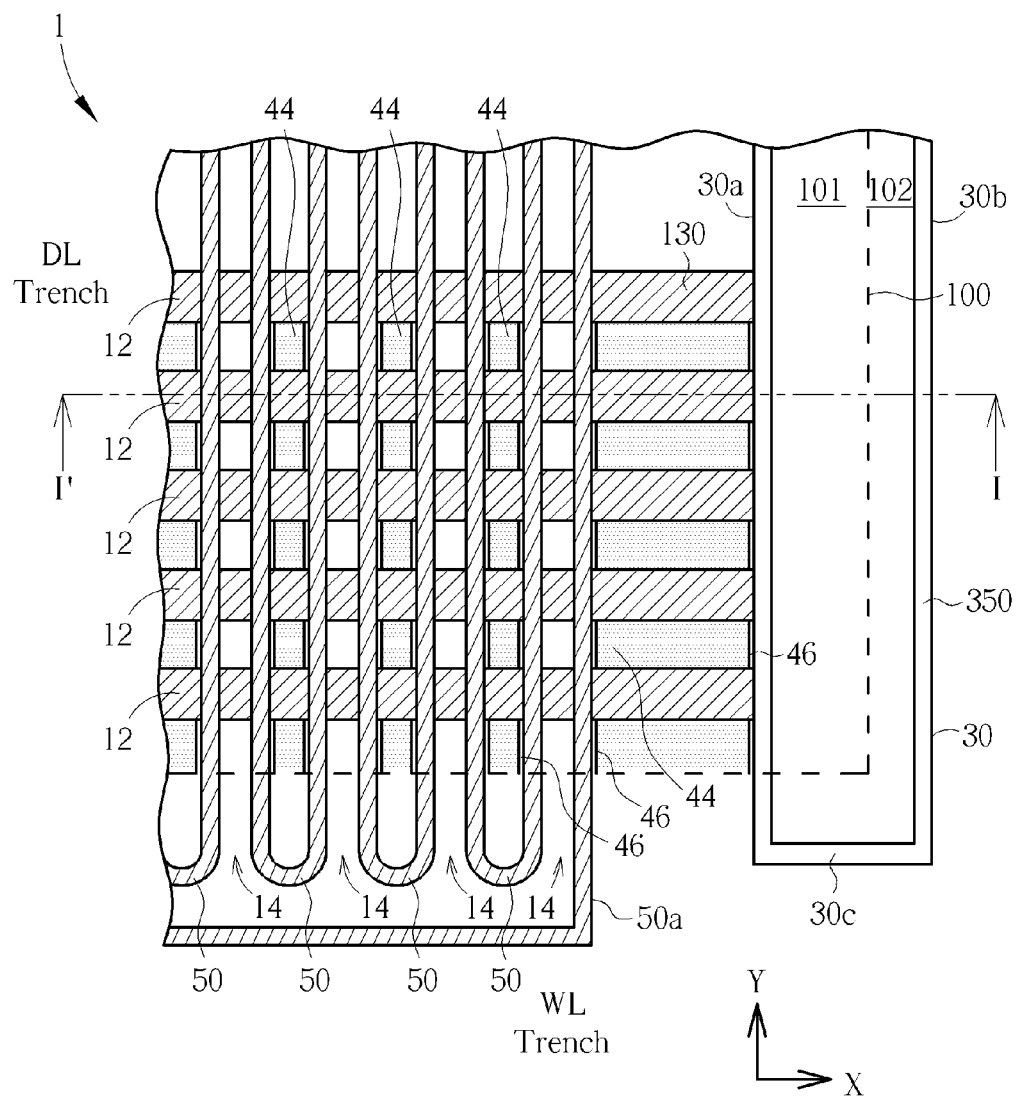
FIG. 1 is a schematic top view showing a portion of a memory cell array in accordance with one embodiment of this invention.

It should be noted that all the figures are diagrammatic. Relative dimensions and proportions of parts of the drawings have been shown exaggerated or reduced in size, for the sake of clarity and convenience in the drawings. The same reference signs are generally used to refer

DETAILED DESCRIPTION

In the following detailed description of the invention, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

The terms wafer and substrate used herein include any structure having an exposed surface onto which a layer is deposited according to the present invention, for example, to form the integrated circuit (IC) structure. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art.

Figure 2A:
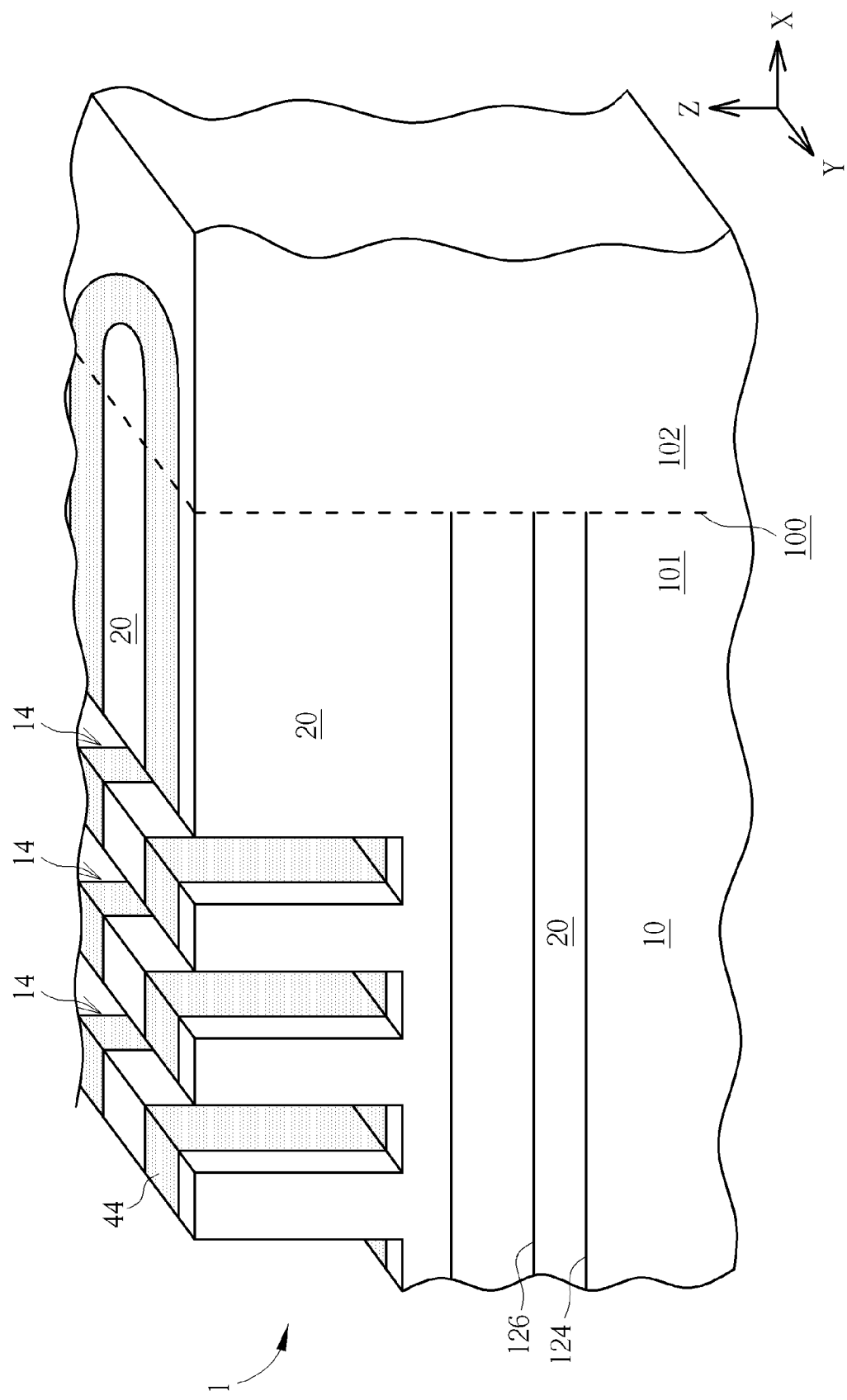
FIG. 2A is a perspective, cross-sectional diagram showing the array structure prior to the AC chop etch step.
Figure 2B:
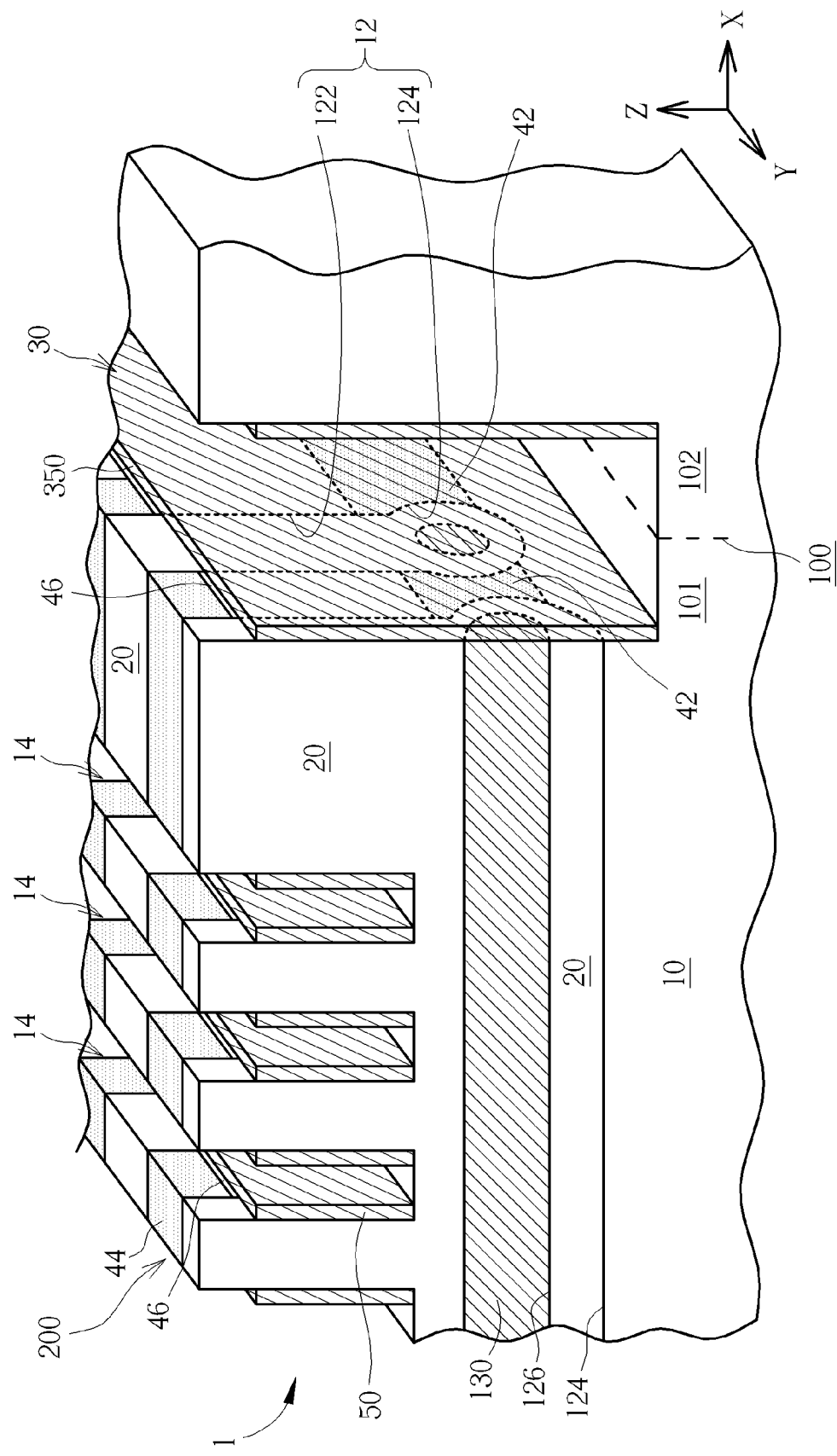
FIG. 2B is a perspective, cross-sectional diagram of the memory cell array taken along line I-I' of FIG. 1.

Please refer to FIGS. 1 and 2A-2B. FIG. 1 is a schematic top view showing a portion of a memory cell array in accordance with one embodiment of this invention. FIG. 2A-2B are perspective, cross-sectional diagrams of the memory cell array taken along line I-I' of FIG. 1. FIG. 2A is a perspective, cross-sectional diagram showing the array structure prior to the AC chop etch step.

As shown in FIG. 1 and FIGS. 2A-2B, the memory array 1 is fabricated in a substrate 10 such as a silicon substrate and is within an area isolated by a peripheral field oxide 102. The interface between the silicon portion 101 of the substrate 10 and the peripheral field oxide 102 is indicated by dashed line 100. The memory cell array 1 comprises a plurality of digitline (DL) trenches 12 extending in parallel to one another along a reference X axis. As can be best seen in FIG. 2B, each of the DL trenches 12 comprises an upper portion 122 and a lower, widened portion 124. A trench fill material layer 20 such as CVD oxide, TEOS oxide, or other dielectric is deposited into each of the DL trenches 12 to thereby seal an air gap 126 within the lower, widened portion 124 of each of the DL trenches 12. According to the embodiment, the air gap 126 may have a width of about 30 nm and a height of about 50~100 nm. It is to be understood that the shape and dimension of the airgap 126 can be optimized by choosing different combinations of a) lower trench 124 etch profiles and b) the conformality of the process used for dielectric deposition. To complete the formation of the digitline structures, there may be additional processes used including planarization after deposition of the trench fill material layer 20.

The memory cell array 1 further comprises a plurality of wordline (WL) trenches 14 extending in parallel to one another along a reference Y axis. According to the embodiment, the bottom of each of the WL trenches 14 is higher than the top of the lower, widened portion 124. The WL trenches 14 intersect the DL trenches 12 to separate a plurality of silicon pillars 200. A vertical-channel transistor (not explicitly shown) is fabricated in each of the silicon pillars 200. The aforesaid vertical-channel transistor may comprise a source doping region 44 disposed at an upper portion of each of the silicon pillar 200 and a drain doping region (not shown) disposed at an lower portion of each of the silicon pillar 200, wherein the drain doping region may be part of a buried digitline 42. A vertical channel (not explicitly shown) is located between the source doping region 44 and the drain doping region in the silicon pillar 200. The buried digitline 42 is a diffusion region that may be formed by using gas phase diffusion (GPD) methods, implants, or any suitable methods.

As shown in FIG. 2B, after formation of the wordline trenches, the next set of steps include lithography to open up the digitline end region using a mask layer. The digitline separation etch will remove the material in the exposed area and the etch will be about the depth of the lower, widened portion 124 or deeper. The masking material (e.g. resist) may have also filled in the wordline trenches 14 and is removed after the etch is completed using well known processes such as resist strip. On each sidewall of each of the WL trenches 14, a sidewall gate dielectric and sidewall word line or sidewall gate 50 are provided. A standalone sidewall wordline 50a is also formed along four edges of the array. The standalone wordline 50a does not connect to any active device. The sidewall gate dielectric is also formed inside the active chop region and help eliminate the contact between the gate material and any exposed substrate or other conducting materials during the chop etch. The sidewall gate 50 may be made of conductive materials such as titanium nitride (TiN) or the like. During the formation of the sidewall gate dielectric and sidewall gate 50, a conductive shield layer 130 may be concurrently deposited into the air gap 126 from an active chop (or digitline chop) trench 30 that extends along the reference Y-axis at both ends of the DL trenches 12 (The active chop trench at the other end of the DL trench 12 is not shown). The conductive shield layer 130 such as TiN may be merely deposited on the interior surface of the air gap 126 and may not completely fill the air gap 126. Alternatively, the conductive shield layer 130 may completely fill the air gap 126. The active chop trench 30 is an open area formed at the digitline ends to separate the digitlines from each other. In another embodiment, an etch step may be added after the formation of the chop trench and before the gate dielectric formation (could be dry etch, wet etch, vapor etch, etc.) with the intent of removing at least some of the dielectric material inside the lower portion of the digitline trenches. This will make the airgap 126 wider and allow for better metal deposition inside the entire length of the airgap 126.

According to the embodiment, the conductive shield layer 130 may be electrically connected to a sidewall conductor 350. The sidewall conductor 350 may be formed on two opposite sidewalls 30a and 30b and may wraparound at either end 30c of the active chop trench 30. To separate the buried digitlines 42, according to the embodiment, the active chop trench 30 is etched to a depth that is deeper than the bottom of the DL trenches 12. According to the embodiment, the conductive shield layer 130 may be electrically coupled to dummy wordlines (not shown) at every edge of the array and may be negative biased or grounded to reduce or eliminate the DL-DL coupling that occurs between two neighboring buried digitlines 42. The aforesaid dummy wordlines are non-active wordlines that account for process non-uniformities. According to the embodiment, a gate dielectric layer 46 is formed on the silicon pillar 200 to insulate the sidewall gate 50. The gate dielectric layer 46 also insulates the sidewall conductor 350 from the buried digitlines 42. It is understood that the WL trenches 14 and the active chop trench 130 may be both filled with insulating material, which is omitted for the sake of simplicity. A capacitor or container may be formed on each of the source doping region 44 in the subsequent processes to complete the memory device.

Figure 3:
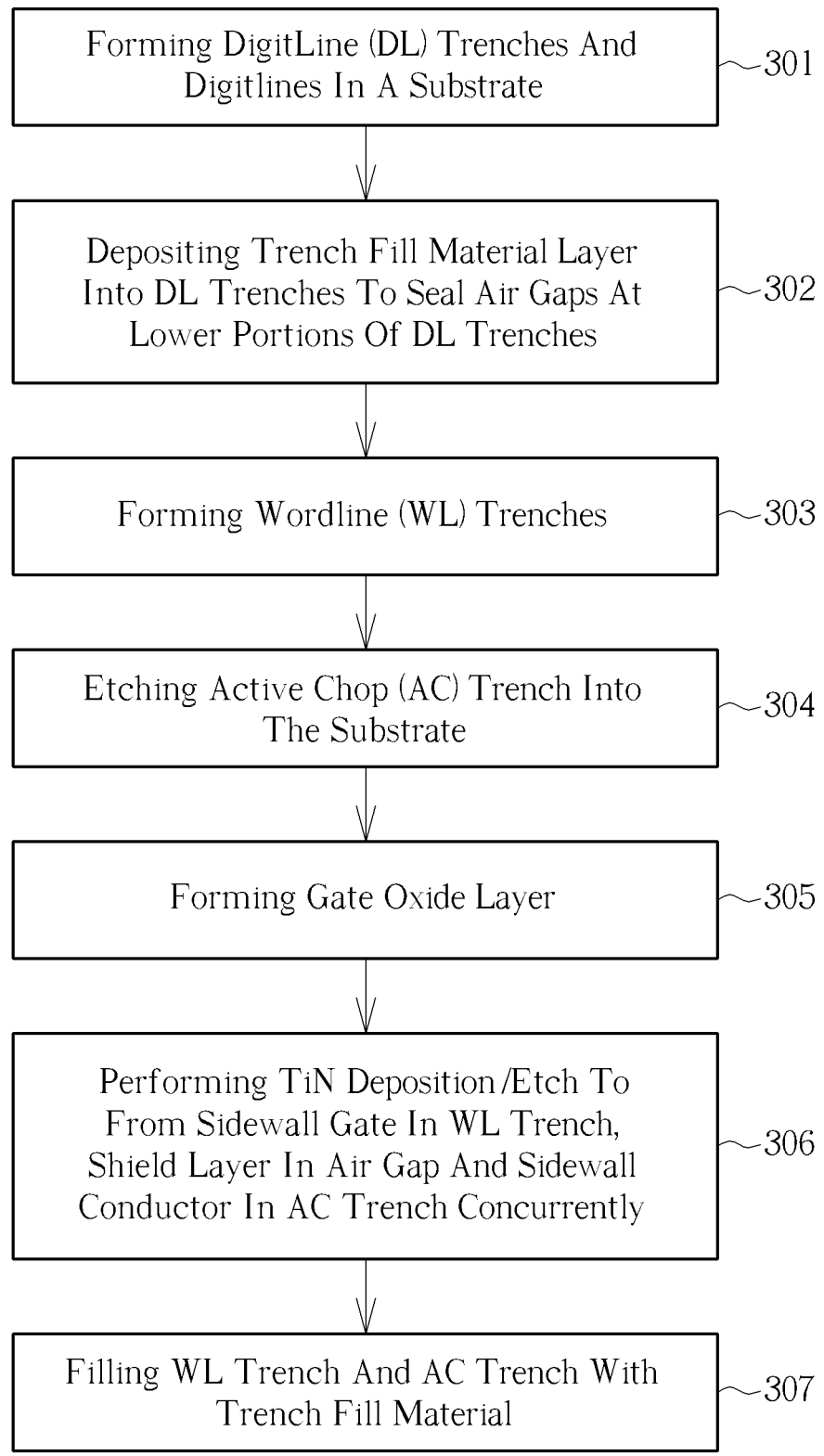
FIG. 3 is a flowchart showing a method for fabricating the memory array as set forth in FIG. 1 and FIGS. 2A-2B in accordance with one embodiment of this invention.

FIG. 3 is a flowchart showing a method for fabricating the memory array as set forth in FIG. 1 and FIGS. 2A-2B in accordance with one embodiment of this invention, wherein like numeral numbers designate like elements, regions or layers. As shown in FIG. 3, and briefly referring back to FIGS. 1-2, in Step 301, a plurality of digitlines (DL) trenches 12 are formed in the substrate 10. Each of the DL trenches 12 may have an upper portion 122 and a lower, widened portion 124. A gas phase diffusion (GPD) method may be performed to form buried digitlines 42 in the silicon portion 101 of the substrate 10 through the lower, widened portion 124. Subsequently, in Step 302, the DL trenches 12 are filled with trench fill material 20 such as TEOS oxide, thereby forming an air gap 126 within the lower, widened portion 124 of each of the DL trenches 12. According to the embodiment, the air gap 126 may have a width of about 30 nm and a height of about 50~100 nm.

In Step 303, wordline (WL) trenches 14 are etched into the substrate 10. The bottom of each of the WL trenches 14 is shallower than either the top of the lower, widened portion 124 or the buried digitlines 42. In Step 304, an active chop (AC) trench 30 is formed in the substrate 10, thereby exposing the air gap 126 and separating the buried digitlines 42. In Step 305, a gate oxide layer 46 is formed on the exposed silicon portion 101 in the WL trenches 14 and the AC trench 30. In Step 306, a TiN deposition process such as atomic layer deposition (ALD) process is carried out to form a conformal TiN layer (e.g., 10~15 nm) on the substrate 10 and a shield layer 130 in the air gap 126. Subsequently, a TiN separation/recess etch is performed to remove a portion of the TiN layer, thereby forming sidewall gates 50 on opposite sidewalls in the WL trenches 14 and the sidewall conductor 350 around the sidewall of the AC trench 30. In Step 307, the WL trench 14 and the AC trench 30 with trench fill material.

According to another embodiment, the wordline formation could complete processing—including the gate dielectric and gate material formation, and gate material recess etch and dielectric deposition and planarization—before the active (or digitline) chop etch is performed. In this case the dielectric formation and metal deposition process for shield formation would not be shared with the wordline formation step. This decoupled process would also allow a significantly thicker deposition of the shield material. This would leave a thicker sidewall conductor 350 and 30c in the chop trench post the etch to recess the shield material in the AC trench region.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory array, comprising:
   a substrate;
   a plurality of digitline (DL) trenches in the substrate, the DL trenches extending along a first direction, wherein each of the DL trench comprises an upper portion and a lower, widened portion;
   a buried digitline disposed in a body portion of the substrate between adjacent two of the DL trenches, wherein the buried digitline and the lower, widened portions of the adjacent two of the DL trenches are situated in a same horizontal plane, and wherein the buried digitline is in direct contact with the lower, widened portions of the adjacent two of the DL trenches;

a trench fill material layer in each of the DL trenches, wherein the trench fill material layer completely fills the upper portion of each of the DL trenches and conformally lines interior surface of the lower, widened portion of each of the DL trenches to thereby seal an air gap within the lower, widened portion;

a plurality of wordline (WL) trenches extending along a second direction;

an active chop (AC) trench disposed at one end of the buried digitline;

a shield layer in the air gap; and a sidewall conductor around a sidewall of the AC trench.

2. The memory array according to claim 1 wherein the WL trenches intersect the DL trenches to separate a plurality of silicon pillars.

3. The memory array according to claim 2 wherein a vertical-channel transistor is fabricated in each of the silicon pillars.

4. The memory array according to claim 2 wherein the sidewall conductor is insulated from the silicon pillars by a gate dielectric layer.

5. The memory array according to claim 1 wherein the shield layer is in direct contact with the sidewall conductor.

6. The memory array according to claim 1 wherein the shield layer comprises TiN.

7. The memory array according to claim 1 wherein the sidewall conductor comprises TiN.

8. The memory array according to claim 1 wherein the trench fill material layer comprises TEOS oxide.

9. The memory array according to claim 1 further comprising a plurality of sidewall gates on sidewalls of the WL trenches.

10. The memory array according to claim 1 wherein the AC trench has a depth that is deeper than a bottom of the DL trench to completely separate the buried digitlines from one another.

11. The memory array according to claim 1 wherein the shield layer in the air gap has a line-shaped structure.

\* \* \* \* \*